(12) United States Patent
Kwon

(10) Patent No.: US 6,519,045 B2
(45) Date of Patent: Feb. 11, 2003

(54) METHOD AND APPARATUS FOR MEASURING VERY THIN DIELECTRIC FILM THICKNESS AND CREATING A STABLE MEASUREMENT ENVIRONMENT

(75) Inventor: Daewon Kwon, Parsippany, NJ (US)

(73) Assignee: Rudolph Technologies, Inc., Flanders, NJ (US)

( * ) Notice: Subject to any disclaimer, the term of this patent is extended or adjusted under 35 U.S.C. 154(b) by 0 days.

(21) Appl. No.: 09/772,901

(22) Filed: Jan. 31, 2001

(65) Prior Publication Data

US 2002/0102748 A1 Aug. 1, 2002

(51) Int. Cl.[7] .............................................. G01B 11/28
(52) U.S. Cl. ...................................................... 356/630
(58) Field of Search ................................. 356/630, 369

(56) References Cited

U.S. PATENT DOCUMENTS

| | | | |
|---|---|---|---|
| 5,131,752 A | | 7/1992 | Yu et al. |
| 5,313,044 A | | 5/1994 | Massoud et al. |
| 5,393,624 A | * | 2/1995 | Ushijima ..................... 118/52 |
| 5,399,229 A | | 3/1995 | Stefani et al. |
| 5,624,190 A | | 4/1997 | Joseph et al. |
| 5,740,034 A | * | 4/1998 | Saeki ........................ 356/601 |
| 5,751,896 A | * | 5/1998 | Sandhu ....................... 219/411 |
| 5,818,596 A | * | 10/1998 | Imai et al. .............. 250/559.27 |
| 5,923,429 A | * | 7/1999 | Takeuchi et al. ............. 356/504 |
| 6,002,485 A | | 12/1999 | Masao |
| 6,004,047 A | * | 12/1999 | Akimoto et al. ............... 118/52 |
| 6,331,890 B1 | * | 12/2001 | Marumo et al. ............. 356/364 |

* cited by examiner

Primary Examiner—Zandra V. Smith
(74) Attorney, Agent, or Firm—Antonelli,Terry, Stout & Kraus, LLP

(57) ABSTRACT

A thickness metrology apparatus and method for accurately determining the actual thickness of thin dielectric film on a semiconductor wafer. The wafer is subjected to a heat treatment such as baking at a heating station of the apparatus to cause desorption of organic compounds from the film. The treated wafer is transferred to a measurement stage where the thickness of the film is measured by an ellipsometer, for example. The actual thickness of the film is determined from the measured thickness and a change in the measured film thickness as a function of time for the film due to absorption of organic compounds onto the film following desorption of organic compounds therefrom.

16 Claims, 3 Drawing Sheets

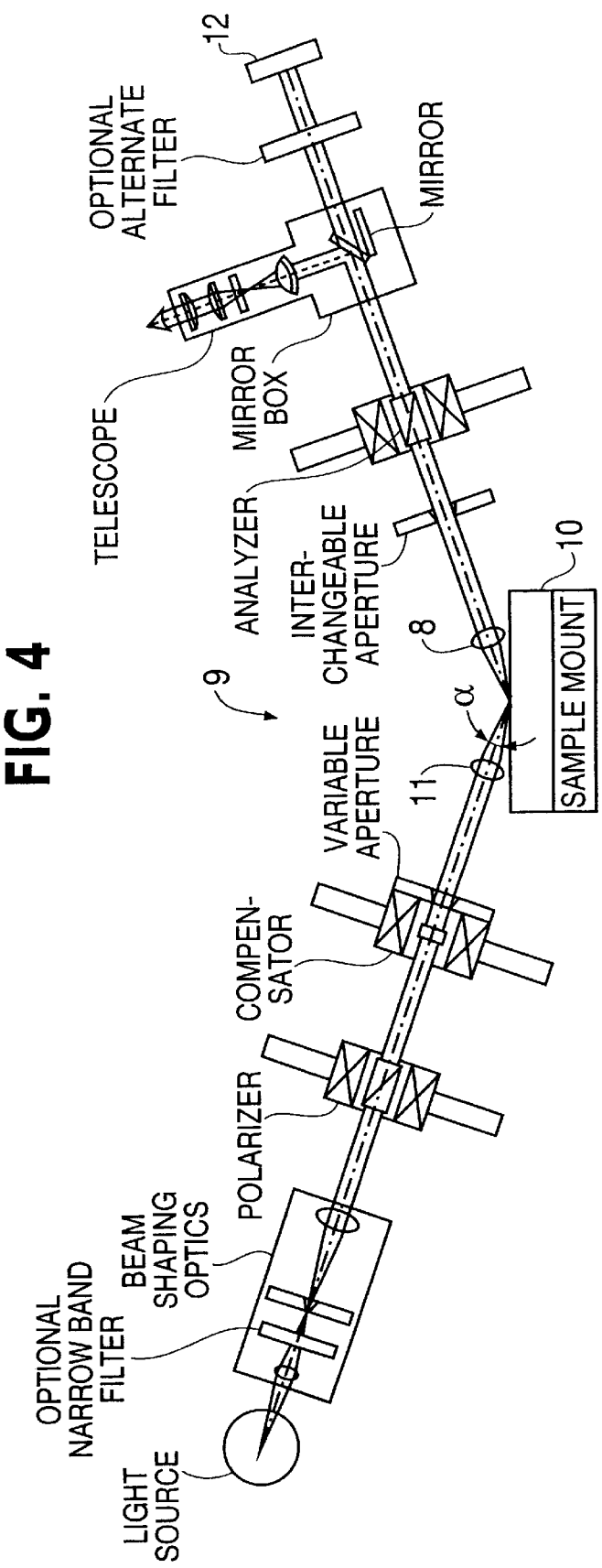

METHOD AND APPARATUS FOR MEASURING VERY THIN DIELECTRIC FILM THICKNESS AND CREATING A STABLE MEASUREMENT ENVIRONMENT

TECHNICAL FIELD

The invention relates to thin film metrology, especially a method and apparatus for measurement of the thickness of thin dielectric film on semiconductor wafers by ellipsometry, interferometry or spectral reflectometry.

BACKGROUND AND SUMMARY

The increasing sophistication of semiconductor technology is challenging manufacturers of semiconductor chips to continually improve upon existing capabilities. These improvements include decreasing the minimum dimensions of devices, including the thickness of gate oxides. These reductions are posing ever-increasing demands on manufacturers of measurement tools. As the tolerances for variations in gate oxide thickness become tighter, thin film metrology apparatus and methods need to be improved to make increasingly precise and accurate measurements. This challenge is compounded by the apparent change in gate oxide thickness over time due to the absorption of water and organic contaminant species, generally referred to hereinafter as "organic compounds", onto the wafer surface following growth of films or thermal treatment of the wafer.

The present invention addresses this need. According to the improved method of the invention, for accurately determining the actual thickness of thin inorganic, dielectric film on a semiconductor wafer, where the film over time absorbs organic compounds onto its surface to increase the apparent, measured thickness thereof, the film is first treated, as by baking, for example, to cause desorption of organic compounds therefrom. Following this, the thickness of the treated thin dielectric film on the wafer is measured, and the actual thickness of the thin film on the wafer is determined in consideration of the measured thickness and a change in the measured film thickness as a function of time for the film due to absorption of organic compounds onto the film following desorption of organic compounds therefrom.

The measurement is preferably performed by ellipsometry, interferometry or spectral reflectometry. The change in the measured film thickness as a function of time according to one embodiment of the invention is determined before performing the treating and measuring. In a second embodiment, the change as a function of time is derived in real time as part of the measuring as by making a plurality of thickness measurements at respective times after treating and deriving the change as a function of time from the difference in the thickness measurements and the difference in time between the thickness measurements.

An apparatus according to the invention for accurately determining the actual thickness of thin dielectric film on a wafer comprises a cassette station for a cassette in which wafers having thin dielectric films to be measured are placed. A heating station having a heater is provided for heating a wafer to cause desorption of organic compounds from a thin dielectric film on the wafer. The apparatus further includes a measurement stage upon which a wafer can be placed for measurement of the thickness of a thin dielectric film on the wafer with a measurement system of the apparatus. A robotics and wafer handing system of the apparatus holds and moves a wafer from a cassette at the cassette station to the heating station, from the heating station to the measurement stage, and from the measurement stage back to a cassette at the cassette station. A controller of the apparatus is in electronic communication with the cassette station, the heating station, the measurement stage, the measurement system and the robotics and wafer handling system.

The method and apparatus of the invention allow gate oxide thickness to be monitored and controlled more accurately during semiconductor manufacture than with conventional methods and apparatus. The invention also enables the tracking of a thin film metrology tool performance from time to time within a fab, from tool to tool within a fab, and from site to site. These and other objects, features and advantages of the present invention will become more apparent from the following detailed description of several embodiments of the invention taken with the accompanying drawings.

BRIEF DESCRIPTION OF DRAWINGS

FIG. 4 is a schematic illustration of an ellipsometer of the measurement system of the apparatus of FIG. 3.

DETAILED DESCRIPTION OF DISCLOSED EMBODIMENTS

Figure 1:
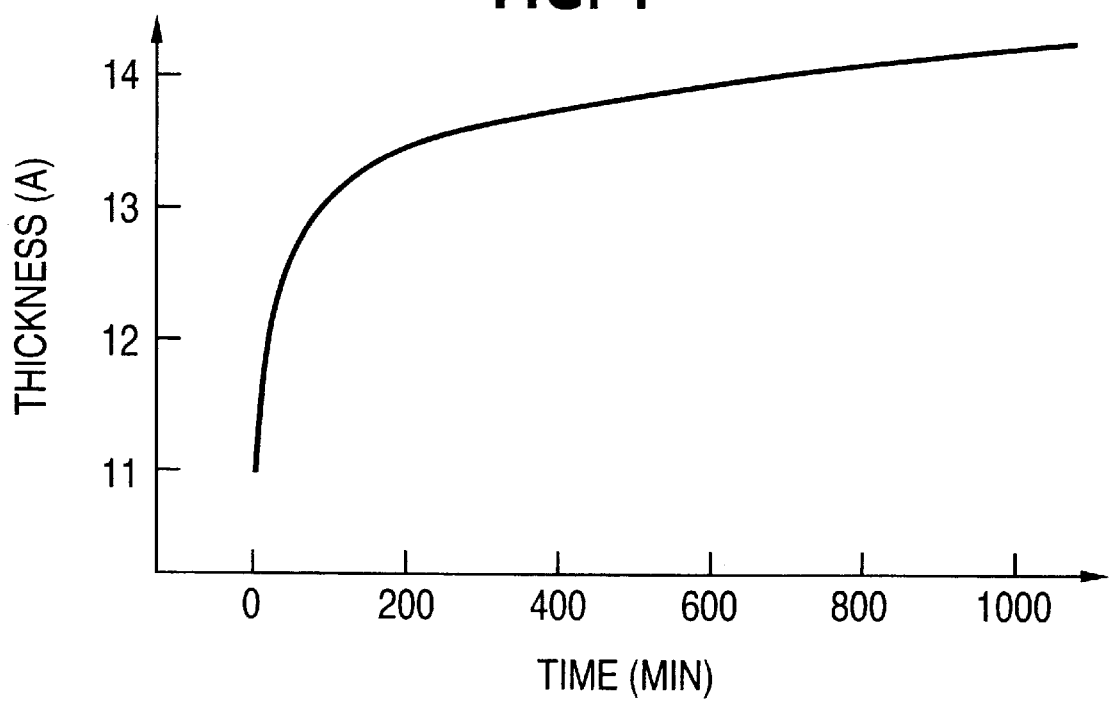
FIG. 1 is a plot of the measured thickness of an oxide layer on a wafer as a function of time, measured using an ellipsometer in an apparatus of the invention as shown in FIG. 3 after the wafer has been removed from a heating station in the apparatus where it was thermally treated to desorb organic compounds therefrom.

Referring now to the drawings, FIG. 1 shows the change as a function of time in the measured oxide thickness of a wafer that has been thermally treated to desorb organic compounds therefrom. The measurements were made using an ellipsometer. The increase in the measured thickness over time is due to the absorption of organic compounds onto the surface of the wafer after the thermal treatment. As seen from FIG. 1, the measured thickness increases rapidly during the first 100 minutes, then more slowly thereafter with complete stabilization taking place over a period of weeks. This layer of organic compounds can be removed by baking the wafer at approximately 300° C. for about 5 minutes, but the layer grows back relatively quickly. The measured thickness from measurements made after the wafer has been heated thus depend on how long the interval is between the heating step and the measurement. Since the time it takes for a measurement to be made during production can vary considerably due to production schedules, queuing, etc., the reported value can differ dramatically from the true or actual oxide layer thickness value.

One apparent solution to this problem is to measure the oxide thickness after the initial rapid change is over, i.e., after about 200 minutes. However, doing so imposes a delay in qualifying the gate oxide forming process step in the manufacture of semiconductor chips, which is very undesirable. Even if a three hour delay were acceptable, the amount of change in the measured oxide thickness depends on the mechanism causing the absorption of organic compounds in the first place. One possible solution is to correlate measurements made at some time after the wafers have been heated with measurements on pristine wafers. However, the source of the organic compounds that are reabsorbed onto the surface is not adequately controlled. Thus, even if it were possible to measure all wafers exactly 400 minutes after the heating step, any change in the source of the organic compounds would cause the correlation to be essentially meaningless.

Figure 2:
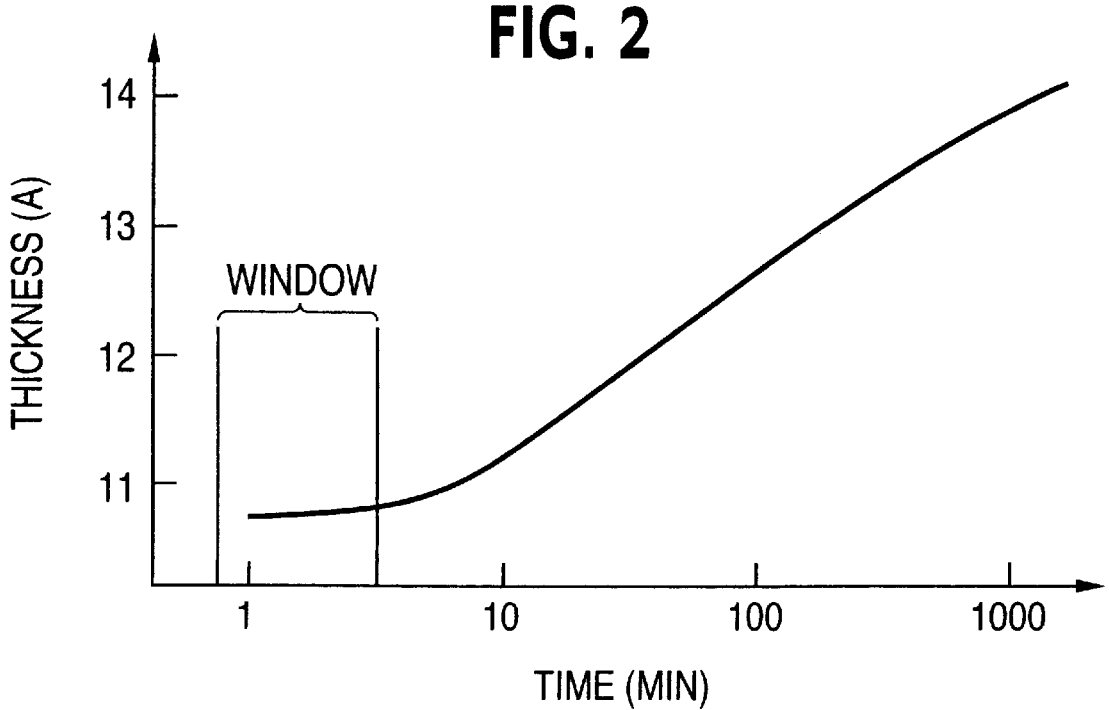
FIG. 2 is a semi-log plot of the measured thickness of the oxide layer on the wafer as a function of time after removal from the heating station.

FIG. 2 shows a semi-log plot of the change in the measured oxide thickness of a silicon dioxide layer on a wafer that occurs following a 5 minute heating step to remove organic compounds which have been absorbed on the wafer surface. The characteristic of FIG. 2 has a flat region from the onset of measurements for approximately 3 minutes, after which the measured thickness increases monotonically. Thus, measurements made within this "Window" as denoted in FIG. 2, i.e., made during the first 3 minutes following the heating step indicate a stable thickness. The present invention exploits this characteristic as discussed further below.

Figure 3:
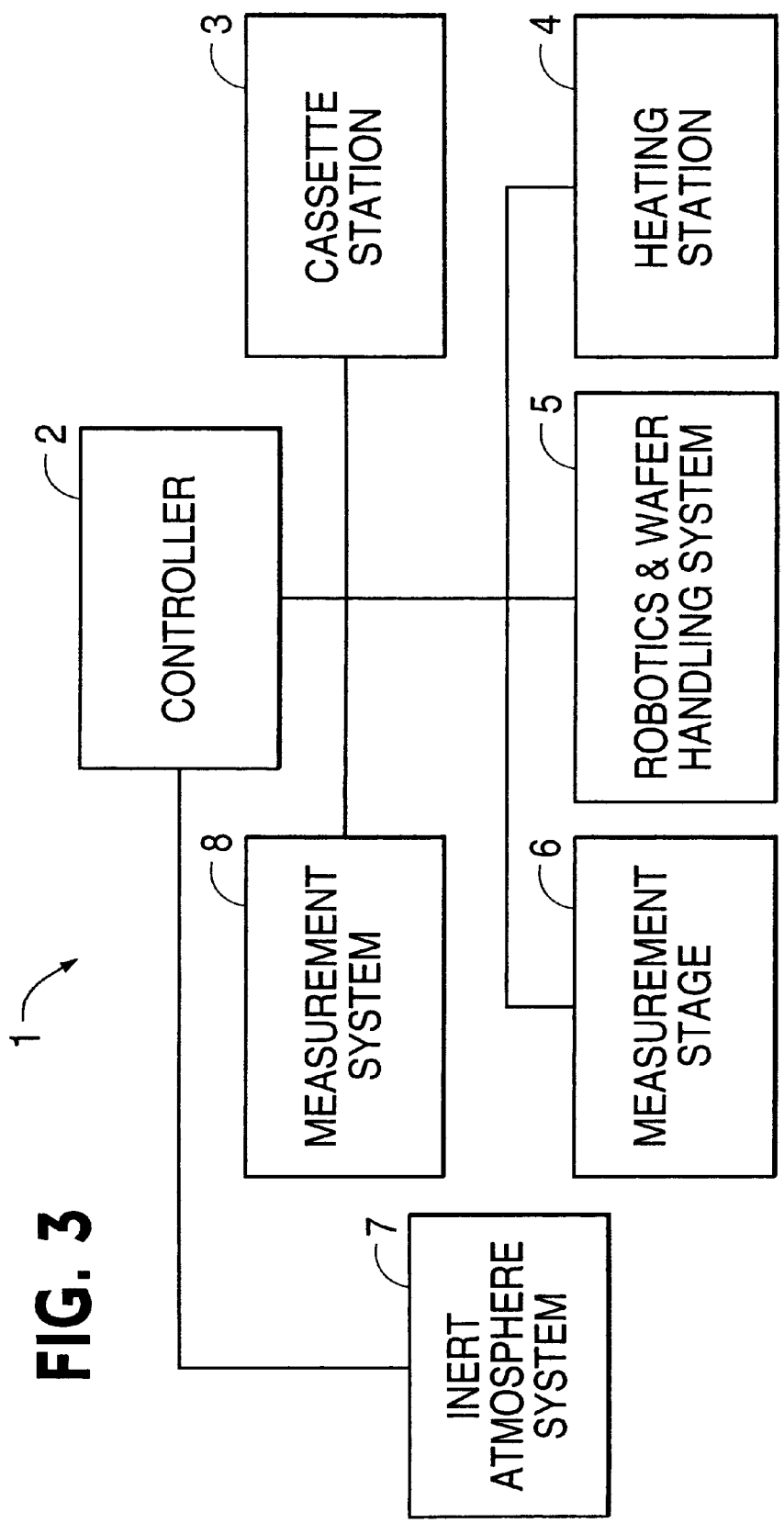
FIG. 3 is a schematic illustration of a film thickness metrology apparatus of the invention with a heating station for practicing the method of the invention.

An apparatus 1 of the invention is shown in FIG. 3. The apparatus 1 includes a controller 2 in electronic communication with a cassette station 3, a heating station 4, a robotics and wafer handling system 5, a measurement stage 6, an optional inert atmosphere system 7, and a measurement system 8. The cassette station 3 includes a cassette in which wafers are placed for measurements. Sensors indicate which slots are occupied in the cassette.

The heating station 4 includes a surface upon which a wafer is placed and a heater for heating the wafer to a predetermined temperature for a predetermined time to cause organic compounds absorbed on the wafer surface to be removed therefrom. The preferred temperature is 300° C. for most processes, but a temperature as low as 250° may be used for alternate processes. Temperatures higher than 300° C. may be used, but higher temperatures (especially those close to diffusion temperatures (~800° C. or so) adversely affect dopant profiles. Oxide growth is also strongly temperature dependent. Therefore, heating the wafer at the low end of the range is preferred. The heater of the station 4 comprises an electrical resistance heater, and preferably includes a temperature sensor and a feedback circuit to ensure the wafer surface remains at the correct temperature.

The optional inert atmosphere system 7 includes a source of an inert gas, e.g., nitrogen, tubing to bring the gas to the wafer, and a filter to extract any organic compounds that may be present in the gas prior to the wafer being exposed to the inert gas. The optional inert atmosphere system may be implemented in any of several ways. One way to implement the inert atmosphere system 7 is to enclose the measurement stage 6 in an enclosure that includes a transparent window through which the thin film metrology tool 9, FIG. 4, of the measurement system 8 makes measurements, and to flow the inert gas into the enclosure. The enclosure is constructed to allow the inert gas to exit the enclosure, carrying with it any moisture and organic compounds that may be present. A second way to implement the optional inert atmosphere system 7 is to include a temporary storage site for one or more wafers after they have been heated. In this implementation, a heated wafer is transported by the robot and wafer handing system 5 to the temporary storage site, which is in an enclosure through which the inert gas flows.

A third way to implement the optional inert atmosphere system 7 is to enclose the surface in the heating station 4 on which the wafer is heated. The inert gas is flowed through this enclosure to accelerate the rate at which organic compounds are removed because the re-deposition rate is reduced. A fourth way to implement the optional inert atmosphere system 7 includes providing a vacuum pump and a vacuum chamber in which the wafer being measured can be loaded following the heating step. The vacuum pump evacuates the chamber so that the deposition rate of any remaining organic compounds in the chamber is minimal. The actual pressure inside the chamber is not important, i.e., high vacuum is not necessary to achieve the benefit of a reduced redeposition rate of organic compounds onto the surface.

The optional inert atmosphere system 7, whether in the form of purging the wafer with inert gas or in the form of a vacuum chamber, serves to extend the period of time during which the actual thickness of the thin film oxide on the wafer can be measured without the accumulation of organic compounds on the surface of the wafer causing an increase in the measured thickness of the oxide layer. The duration of this extended period of time ranges up to tens of minutes. In the absence of the inert atmosphere system, there is a stable thickness time of approximately 3 minutes as discussed with respect to FIGS. 1 and 2.

The robotics and wafer handling system 5 of the apparatus 1 includes a robot with a reticulated robot arm and an end-effector with which to hold a wafer so that it can be moved from a cassette at the cassette station 3 to the heating station 4, from the heating station to the measurement stage 6—possibly by way of an intermediate stop at a temperature storage site as part of an inert atmosphere system, and finally back to the cassette. The measurement stage 6 includes a test surface upon which the wafer is placed for measurements, and translation stages to provide wafer manipulation in three degrees of freedom. The measurement stage preferably includes two linear stages arranged at right angles with respect to one another and in the plane of the test surface, and another linear stage to move the wafer in the direction of the measurement system. However, R-θ stages may also be used.

The measurement system 8 in the disclosed embodiment of the apparatus 1 comprises a thin film metrology tool 9 for measuring the oxide film thickness. The tool 9 is an ellipsometer as shown schematically in FIG. 4. The ellipsometer 9 is like that disclosed in assignee's U.S. Pat. No. 5,166,752 in that it includes a first optical assembly for directing polarized light onto the surface 10 and a second optical assembly for analyzing the polarization state of the light reflected from the surface. The first optical assembly for directing includes a light source, beam-shaping optics with an optional optical narrow band filter, a polarizer, a compensator and a variable aperture as shown in FIG. 4. In addition, the first optical assembly for directing further includes a third optical assembly, shown schematically at 11, for simultaneously directing polarized light from a single beam of light from the light source onto the surface 10 at different angles of incidence. The second optical assembly for analyzing includes a detector array 12 as well as the analyzer and the other elements as disclosed in U.S. Pat. No. 5,166,752.

Other metrology tools than ellipsometer 9 could be employed in the measurement system 8 in the apparatus 1 of the invention. For example, ellipsometers in other configurations including single angle ellipsometers, multi-angle ellipsometers, interferometers, and spectral reflectometers which may cover the visible, ultraviolet and infrared wavelength ranges could be used.

A first embodiment of the method of the invention uses the apparatus 1 to obtain very accurate measurements of film thickness on each wafer of a plurality of wafers stored in a cassette. The method includes the steps of:

(1) transferring a wafer from the cassette at cassette station 3 to the heating station 4 using the robotics and wafer handling system 5;

(2) heating the wafer at the heating station 4 for a predetermined time at a predetermined temperature (e.g., 5 minutes at 300° C.);

(3) removing the wafer from the heating station;

(4) loading the wafer onto the measurement stage 6;

(5) measuring the thickness of a selected film in desired locations, where all of the measurements are made within a certain time interval (e.g., 3 minutes) from the time the first wafer is removed from the heating station; and (6) returning the measured wafer to the cassette.

By conducting the measuring with measurement system 8 at a time after the heating which is within the stable thickness region or window of the characteristic shown in FIG. 2, the measured thickness corresponds to the actual thickness. This method could be applied on monitor wafers only to minimize the affect on the throughput.

A second method according to the invention of improving throughput using the apparatus 1 and the method of the aforementioned first embodiment of the present invention includes the steps of:

(1) transferring a first wafer stored in the cassette directly to the measurement stage 6;

(2) measuring the wafer while it is at room temperature to obtain a first measurement of a same selected film;

(3) using the first method, as set forth above, to obtain a second measurement of the thickness of the selected film of the first wafer;

(4) determining a correction value based on the difference between the second measurement and the first measurement;

(5) loading a second wafer from the cassette at cassette station 3 directly onto the measurement stage 6 with handling system 5;

(6) measuring the selected film thickness of the second wafer on the measurement stage without heating the wafer;

(7) using the correction value obtained in step (4) to compensate for not having heated the second wafer, thereby obtaining a corrected measurement of the selected film thickness; and (8) repeating steps (5) through (7) until all of the wafers in the cassette have been measured.

This second method presumes that in a production run, the wafers in a particular lot (i.e., a container capable of holding 25 wafers) experience essentially the same environmental conditions, and so are affected the same way. Thus, careful measurement of one wafer provides an accurate correction value applicable to other wafers. For example, if the difference between the second measurement and the first measurement of the oxide thickness is 2.5 Å, then it is highly likely that cold measurements made on the remaining wafers in the lot will result in measured values that exceed the actual thickness value by 2.5 Å.

A third method of the invention which can be practiced with the apparatus 1 is suitable for tracking the approximate growth rate of an organic film. The method includes steps of:

(1) transferring a wafer from the cassette to the heating station;

(2) heating the wafer for a predetermined time (e.g., 5 minutes) at a predetermined temperature (e.g., at 300° C.);

(3) transferring a wafer from the heating station to the measurement stage;

(4) measuring the thickness of a selected film at a first measurement site to obtain a first measurement;

(5) recording the time at which the first measurement was made;

(6) measuring the thickness of the same selected film on the wafer at a second measurement site, and recording the time at which the second measurement is made;

(7) repeating step (6) at multiple sites;

(8) measuring the thickness of a selected film at the first measurement site to obtain a last measurement at the first measurement site;

(9) recording the time at which the last measurement was made;

(10) determining a first correction value based on the difference between the first and last film thickness measurements;

(11) determining a second correction value determined from the difference in time between the first and third film thickness measurements;

(12) correcting the measurements taken in steps (6) and (7) using the first correction value obtained in step (10) and the second correction value obtained in step (11); and

(13) returning the wafer to the cassette.

An algorithm for using these correction values assumes that the growth rate in a short time interval can be determined with sufficient accuracy using a linear growth model. The algorithm of the present invention includes the steps of:

(1) calculating the effective growth rate (the second measurement at the first measurement site minus the first measurement divided by the difference in time between the two measurements); and (2) correcting the cold measurements using the linear growth rate model.

In a fourth embodiment of the method of using the apparatus 1 of the present invention, very accurate measurements of the film thickness on each wafer of a plurality of wafers stored in the cassette are obtained, where the method includes the steps of:

(1) transferring a wafer on which there is a thin film having a thickness to be measured from the cassette to the heating station;

(2) heating the wafer for a predetermined time (e.g., 5 minutes) at a predetermined temperature (e.g., at 300° C.);

(3) removing the wafer from the heating station;

(4) loading the wafer onto the measurement stage;

(5) waiting a first-predetermined amount of time (e.g., 3 minutes);

(6) measuring the thickness of a selected film at a desired location and storing the measured thickness and the time in a table;

(7) repeating step (6) to obtain a plurality of measurements covering a 10 minute time span;

(8) using a linear regression method and the data in the table to obtain an equation describing a straight line through the data collected in step (6);

(9) using the equation obtained in step (8) to extrapolate back to a second predetermined time (e.g., 2 minutes after the wafer completed being heated in step (2) above);

(10) identifying the extrapolated thickness according to step (9) as the actual thickness of the thin film; and

(11) returning the measured wafer to the cassette.

This method eliminates the error associated with simply extrapolating a straight line fit of the data back in time to the end of the heating step since the thickness remains essentially unchanged for several minutes. Once the thickness beings to rise, it does so rapidly, and is well suited to a straight line fit. However, extrapolation back to zero is affected by the delay in the onset of the increase in the film thickness. This method overcomes that limitation.

The heater of the heating station 4 in the disclosed embodiment is an electrical resistance heater with a temperature sensor and a feedback circuit. However, instead a laser or other heat source could be used to locally heat the wafer to desorb organic compounds from the surface of the film to be measured. The use of only local heating of this type would advantageously reduce the thermal radiation emitted by the wafer after it has been heated at the heating station 4 and thereby reduce any risk that the thermal radiation emitted by the wafer after heating at station 4 could cause the optical constants of the components of the ellipsometer 9 at measurement stage 6 to change. In any case, careful design of the measurement system 8 to reduce this risk is preferred.

From the above, it will be readily apparent to one skilled in the art that the methods and apparatus of the invention allow semiconductor manufacturers to monitor and control gate oxide thicknesses more accurately. A second advantage of the present invention is that it allows users of the metrology apparatus to track tool performance from time to time within a fab, from tool to tool within a fab, and from site to site. For example, a method of the invention for producing thin dielectric film of a desired thickness on semiconductor wafers with a production process according to the invention, where the film produced on the wafers over time absorbs organic compounds onto its surface to increase its apparent, measured thickness, comprises measuring the thickness of a thin dielectric film produced on the surface of a wafer by the production process; determining the actual thickness of the thin film on the wafer in consideration of the measured film thickness and a change in the measured film thickness as a function of time due to absorption of organic compounds onto the film following desorption of organic compounds therefrom; and, in a case the actual thickness does not correspond to the desired thickness, changing a control factor or process condition for the production process to adjust the actual film thickness being produced on the wafers by the process for conforming the actual film thickness being produced on the wafers to the desired thickness.

The production process referred to herein produces an oxide film on the wafers by heating the wafers in a furnace having an oxidizing atmosphere. The control factor or process condition changed for adjusting the actual film thickness being produced on the wafers can be the time and/or temperature of treatment of the wafers in the furnace, or other control factor or process condition. The method and apparatus of the invention can also be used in connection with other processes for production of thin films, for example, nitride films.

The method and apparatus of the invention are also useful for monitoring the performance of a thin film metrology tool which is used to measure the thickness of thin films produced on semiconductor wafers by a production process, where the film produced on the wafers over time absorbs organic compounds onto its surface to increase its apparent, measured thickness. For this purpose, a method of the invention comprises providing a monitor wafer having a film thereon whose actual thickness is known apart from its apparent, measured thickness which may be increased due to absorption of organic compounds onto its surface. The film on the monitor wafer is treated to cause desorption of organic compounds therefrom. The thickness of the treated thin dielectric film on the wafer is measured with the metrology tool. The actual thickness of the thin film on the wafer is determined in consideration of the measured thickness and a change in the measured film thickness as a function of time due to absorption of organic compounds onto the film following desorption of organic compounds therefrom. The determined actual thickness of the thin film on the wafer is compared with the known actual thickness for monitoring the performance of the metrology tool. This method may be repeated with the same metrology tool from time to time during the production process to track the tool's performance. The method can also be performed with another metrology tool using the monitor wafer to monitor the performance of more than one metrology tool within a common fab or located at different sites.

While we have shown and described only several embodiments of the present invention, it will be readily understood by the skilled artisan that variations of the methods and apparatus are possible without departing from the scope of our invention. Therefore, we do not wish to be limited to the details shown and described herein but intend to cover all such changes and modifications as are encompassed by the scope of the appended claims.

I claim:

1. An apparatus for accurately determining the actual thickness of thin inorganic, dielectric film on a wafer, the film over time absorbing organic compounds onto its surface to increase the apparent, measured thickness thereof, said apparatus comprising;

a cassette station for a cassette in which wafers having thin inorganic, dielectric films to be measured are placed;

a heating station having a heater for heating a wafer to a temperature of at least 250° C. and for a time to cause desorption of organic compounds from a thin inorganic, dielectric film on the wafer;

a measurement stage upon which a wafer can be placed for measurement of the thickness of a thin inorganic, dielectric film on the wafer;

a measurement system to measure the thickness of a thin inorganic, dielectric film on a wafer on said measurement stage;

a robotics and wafer handling system for holding and moving a wafer from a cassette at said cassette station to said heating station, from said heating station to said measurement stage, and from said measurement stage back to a cassette at said cassette station; and a controller in electronic communication with said cassette station, said heating station, said measurement stage, said measurement system and said robotics and wafer handling system.

2. The apparatus according to claim 1, further comprising an inert atmosphere system providing an inert atmosphere for a wafer which has been heated by said heater to extend a period of time during which the actual thickness of a thin inorganic, dielectric film on the wafer can be measured without accumulation of organic compounds on the film.

3. The apparatus according to claim 2, wherein said inert atmosphere is selected from the group consisting of an inert gas, chemically filtered air, dry air and a vacuum.

4. The apparatus according to claim 2, wherein said inert atmosphere is provided at said measurement stage.

5. The apparatus according to claim 2, wherein said inert atmosphere is provided at a temporary storage for wafers after they have been heated at said heating station.

6. The apparatus according to claim 2, wherein said inert atmosphere is provided at said heating station.

7. The apparatus according to claim 1, wherein said measurement system is one of an ellipsometer, an interferometer and a spectral reflectometer which covers the visible, ultraviolet and infrared ranges.

8. The apparatus according to claim 7, wherein said measurement system is a multi-angle/multi-wavelength ellipsometer.

9. A film thickness metrology method for accurately determining the actual thickness of a thin inorganic film on a semiconductor wafer, the film over time absorbing organic compounds onto its surface to increase the apparent, measured thickness thereof, said method comprising:

transferring a wafer having a thin inorganic film to be measured from a cassette holding said wafer to a heating station;

heating the wafer at the heating station to a temperature and for a time to cause desorption of organic compounds from the thin inorganic film on the wafer;

removing the wafer from the heating station;

loading the wafer onto a measurement stage;

measuring the thickness of said thin inorganic film at a desired location on the wafer; and wherein said method includes determining the actual thickness of the thin inorganic film on the wafer in consideration of said measured thickness and a change in the measured film thickness as a function of time for the film due to absorption of organic compounds onto the inorganic film following desorption of organic compounds therefrom.

10. The method according to claim 9, wherein said change as a function of time has a region of time immediately following desorption of organic compounds from the inorganic film where the measured thickness is stable after which the measured thickness increases due to absorption of organic compounds, said determining including conducting said measuring at a time after said heating which is within this region so that said measured thickness corresponds to said actual thickness.

11. The method according to claim 10, further comprising measuring the thickness of the thin inorganic film on said wafer before said heating, determining a correction value based on the difference between the measured film thicknesses before and after said heating, and using said correction value to correct a film thickness measurement of a thin inorganic film on another wafer to obtain the actual thickness thereof without having to heat said the another wafer to cause desorption of organic compounds therefrom.

12. The method according to claim 9, wherein said change as a function of time for the film is known before performing said heating and measuring.

13. The method according to claim 9, wherein said measuring includes making a plurality of measurements of the film at respective times after said heating, and deriving said change as a function of time from the difference in said thickness measurements and the difference in time between said thickness measurements.

14. The method according to claim 13, wherein said change as a function of time is derived assuming a linear growth rate for the film between said thickness measurements.

15. The method according to claim 14, wherein said determining the actual thickness includes using a linear regression method to extrapolate said linear growth rate back to a predetermined time after said heating but before said measuring to determine said actual thickness.

16. The method according to claim 15, wherein said predetermined time is within a region of time immediately following desorption of organic compounds from the film where the measured thickness is stable after which the measured thickness increases due to absorption of organic compounds.

* * * * *